United States Patent [19]

Sato

[11] Patent Number: 4,970,637

[45] Date of Patent: Nov. 13, 1990

[54] DIGITAL ANTI-ALIASING FILTER

[75] Inventor: Takeshi Sato, Ootawara, Japan

[73] Assignee: Kabushiki Kaisha Toshiba, Kawasaki, Japan

[21] Appl. No.: 208,489

[22] Filed: Jun. 20, 1988

[30] Foreign Application Priority Data

Jun. 22, 1987 [JP] Japan .................. 62-154882

[51] Int. Cl.$^5$ .............................. G06F 7/00
[52] U.S. Cl. ................ 364/715.06; 364/724.01; 364/413.25
[58] Field of Search ............ 364/724.01, 724.10, 364/724.16, 724.19, 825, 413.25, 715.06; 341/155

[56] References Cited

U.S. PATENT DOCUMENTS

| | | | |
|---|---|---|---|
| 3,428,946 | 2/1969 | Batcher | 364/715.06 X |
| 4,612,625 | 9/1986 | Bertrand | 364/724.10 |
| 4,621,217 | 11/1986 | Saxe et al. | 364/724.16 X |
| 4,639,739 | 2/1972 | Golden et al. | 364/724.10 |
| 4,653,017 | 3/1987 | Colbeck et al. | 364/724.10 |
| 4,703,447 | 10/1987 | Lake, Jr. | 364/724.16 |
| 4,717,951 | 1/1988 | Fling | 364/724.19 X |
| 4,789,995 | 12/1988 | Hurst et al. | 364/724.01 X |

OTHER PUBLICATIONS

Gourlay et al., "Circuit for Finding the Minimum or Maximum of a Set of Binary Numbers", IBM Tech. Disclosure Bulletin, vol. 25, No. 7A, p. 3318, 12/1982.
IEEE Transactions on Communications, vol. Com-32, No. 5, May 1984, "The Output Distribution of Median Type Filters", Thomas A. Nodes, Member.

Primary Examiner—Jerry Smith
Assistant Examiner—Steven G. Kibby
Attorney, Agent, or Firm—Cushman, Darby & Cushman

[57] ABSTRACT

An original analog signal is supplied to A/D converter 2 through analog LPF 1. LPF 1 has a cutoff frequency of fa/2 (fa is the frequency of a clock pulse supplied to A/D converter 2). LPF 1 limits a frequency band determined by filter characteristics. An output from A/D converter 2 is supplied to sample circuit 4 through maximum filter 3. An output from sample circuit 4 is supplied to a circuit of the next stage as final output Dout. Maximum filter 3 can arbitrarily set the number of sampling interval data (filter width). Maximum filter 3 is a nonlinear filter for outputting a maximum value of input data within a set filter width as a representative value of the width. The clock pulse of frequency fa is also supplied to maximum filter 3 so that input/output operation of data is synchronized with the clock pulse. The filter width of maximum filter 3 is determined in accordance with fa/fb (fb is the frequency of a clock pulse supplied to sample circuit 4, and fa≧fb).

15 Claims, 15 Drawing Sheets

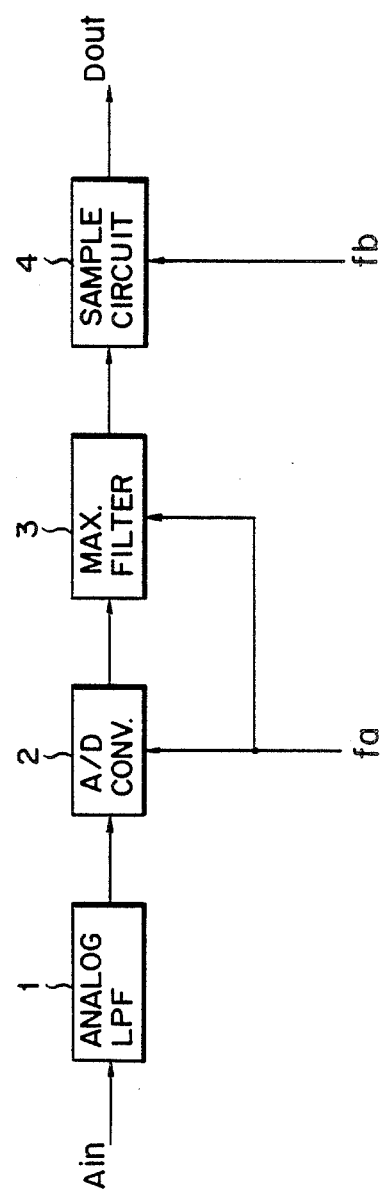
F I G. 1

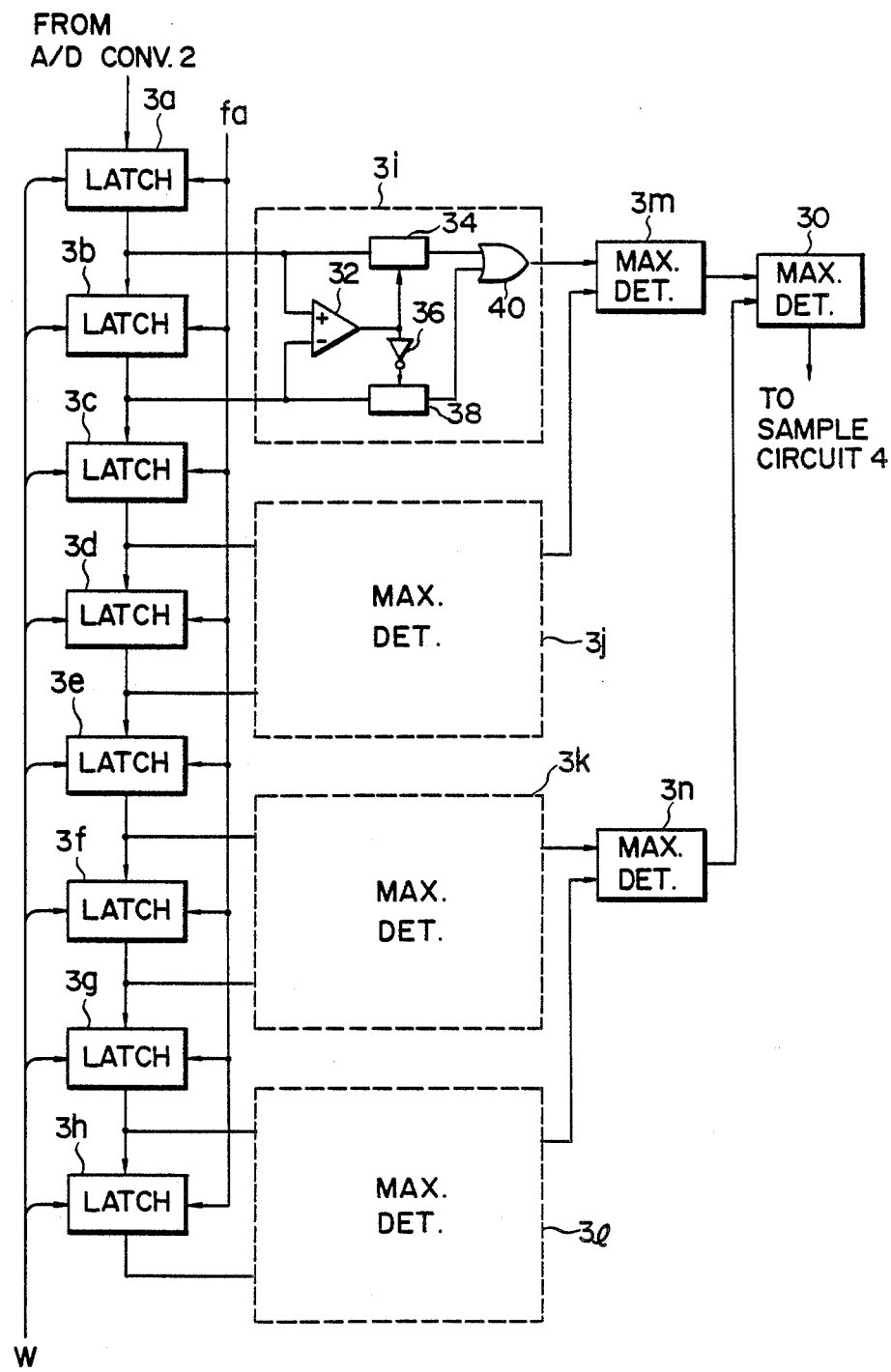
F I G. 2

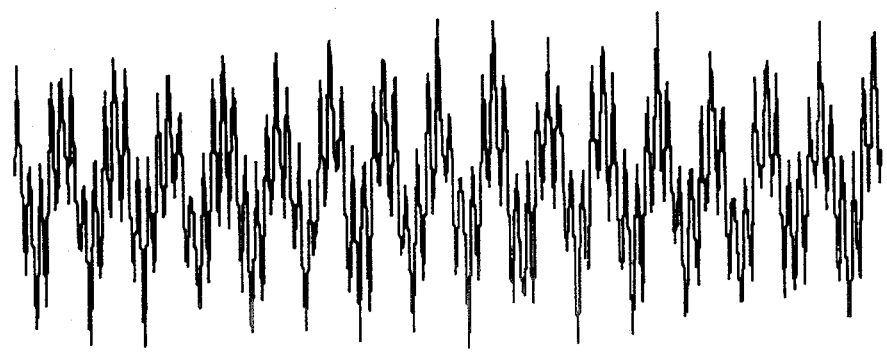
F I G. 3A
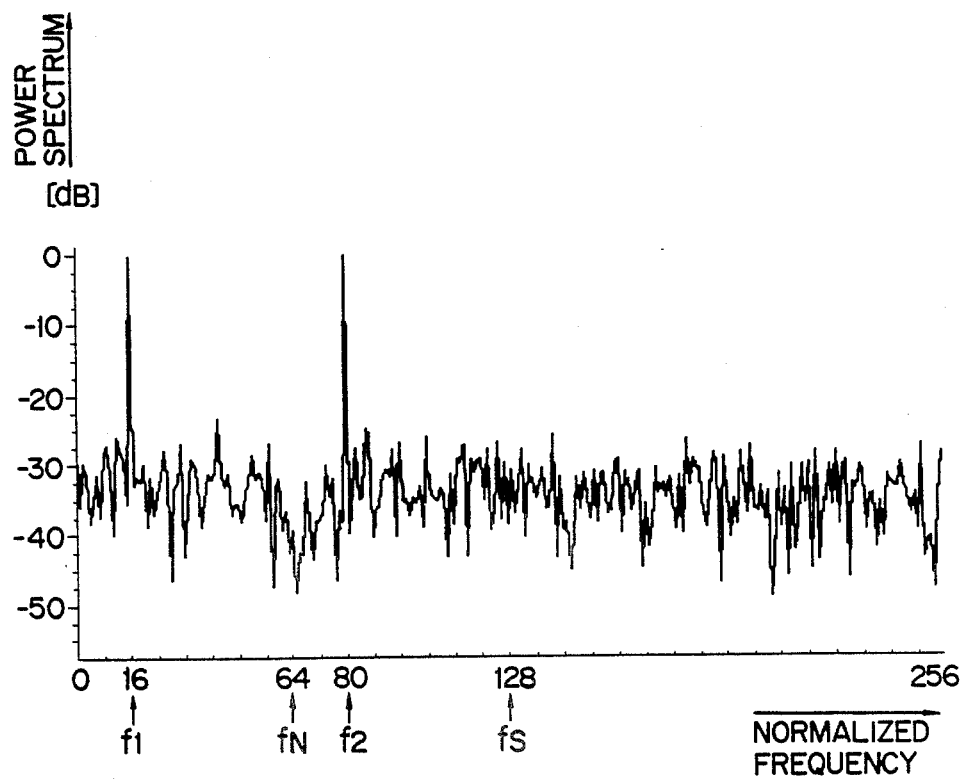
F I G. 3B

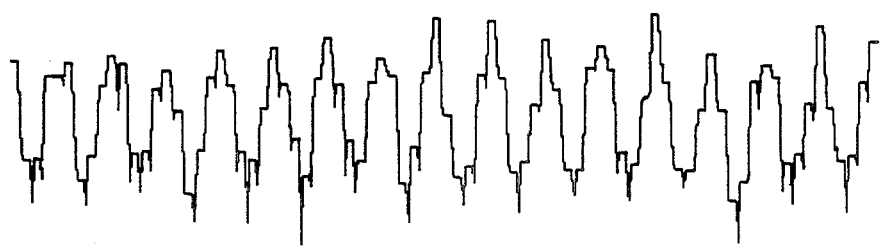
F I G. 5A
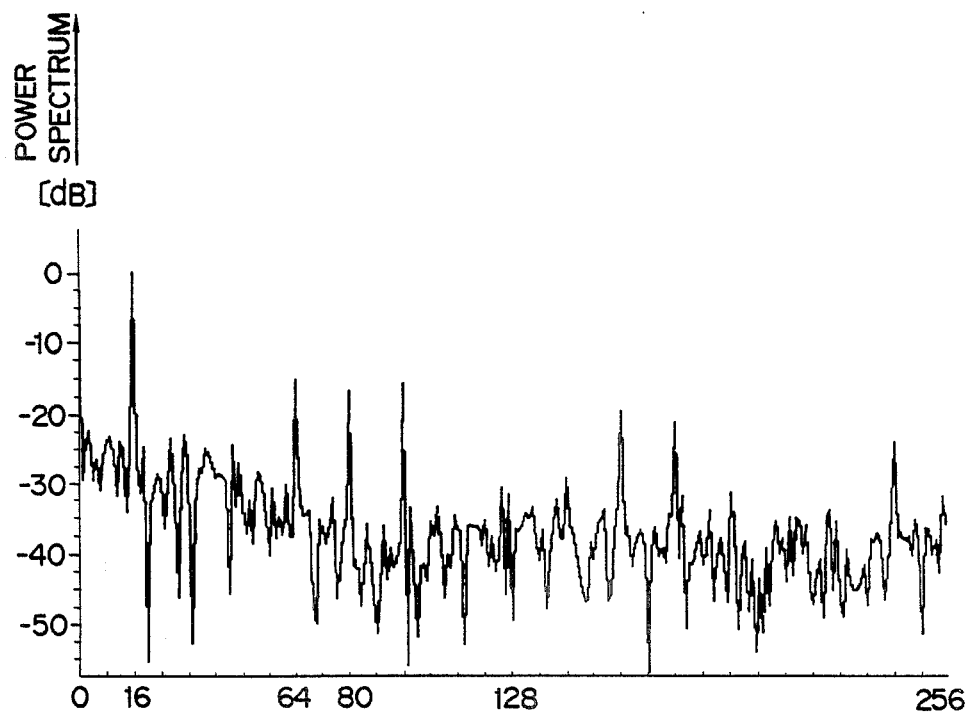
F I G. 5B

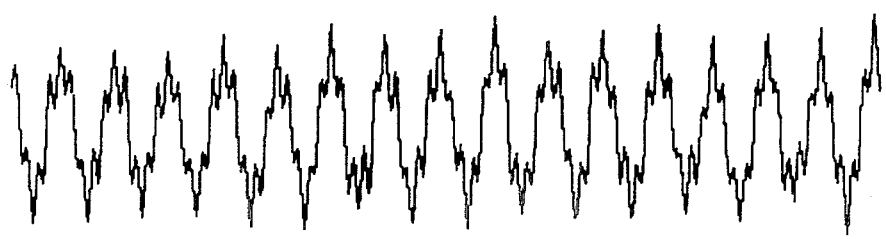
F I G. 7A
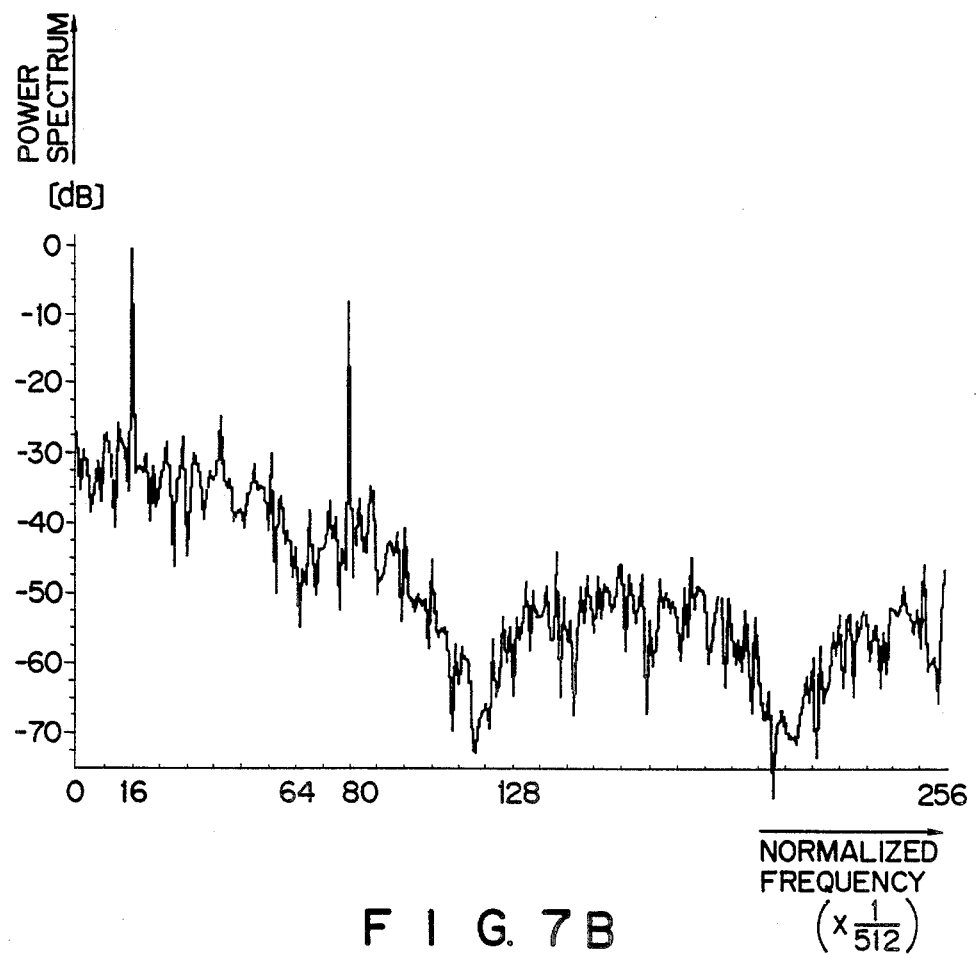
F I G. 7B

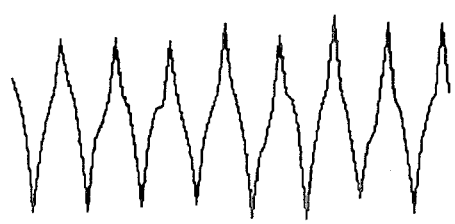
F I G. 8A
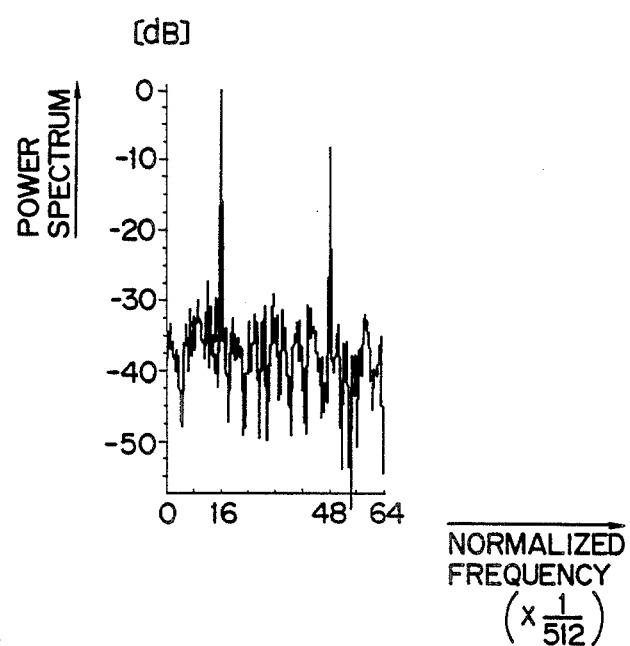
F I G. 8B

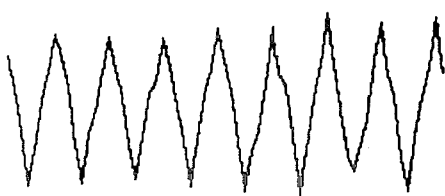
F I G. 10A
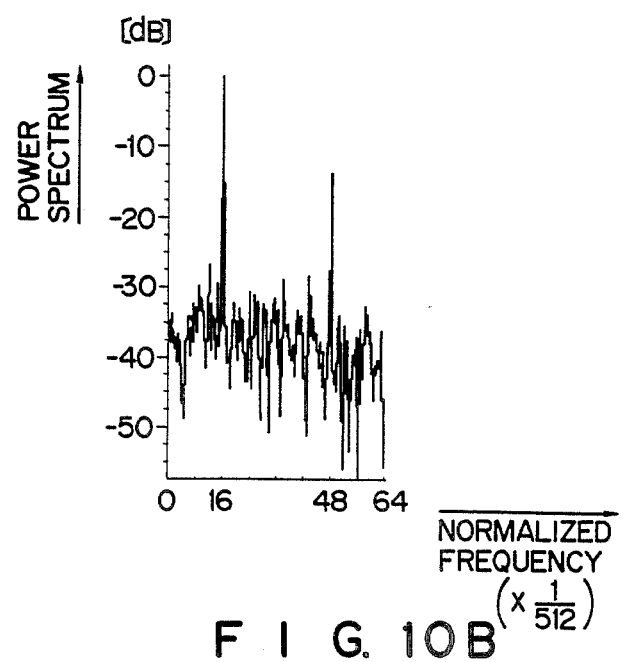
F I G. 10B

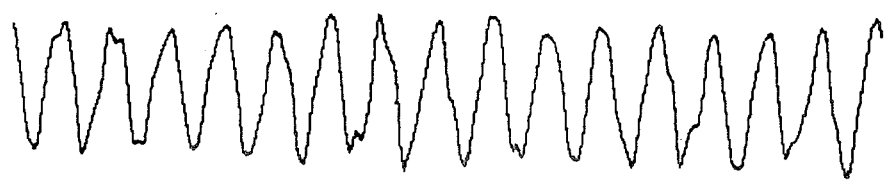
F I G. 11A
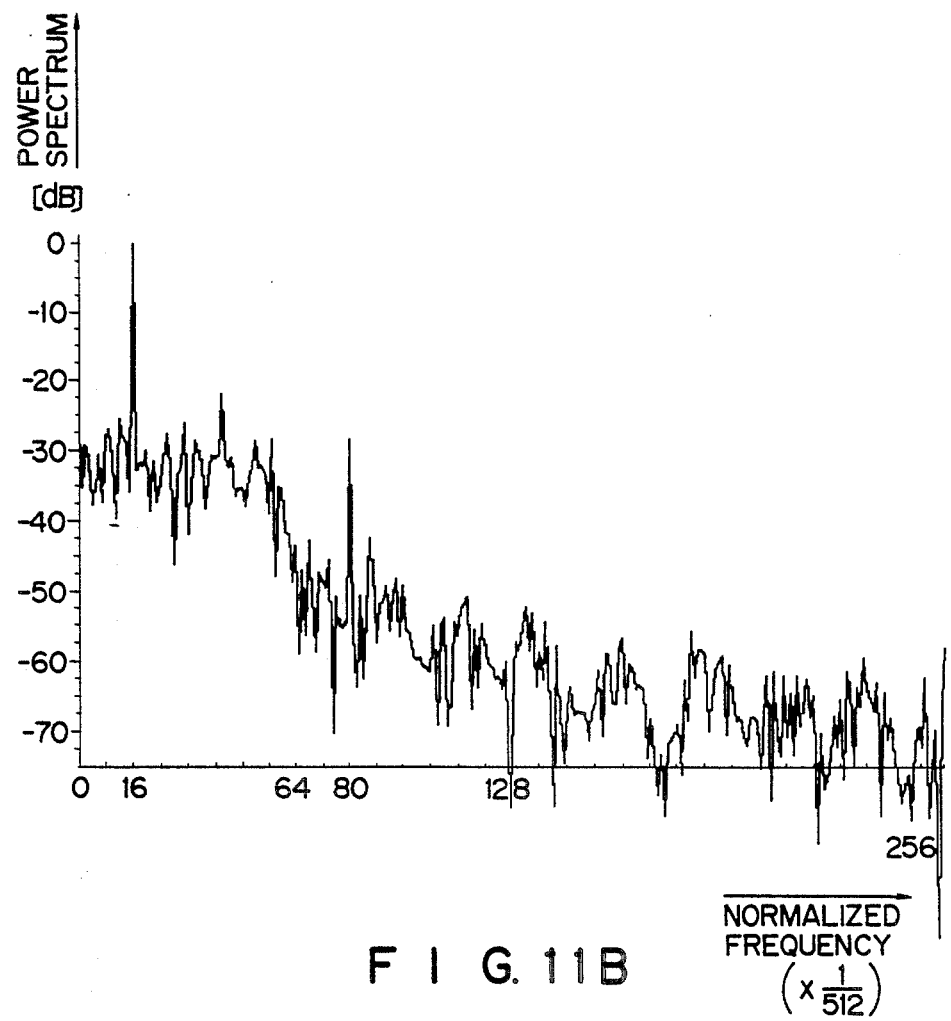
F I G. 11B

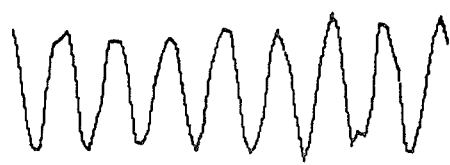
F I G. 12A
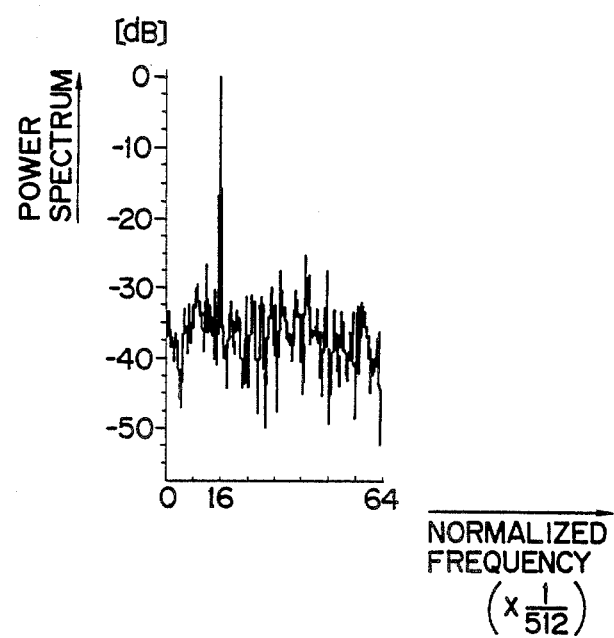
F I G. 12B

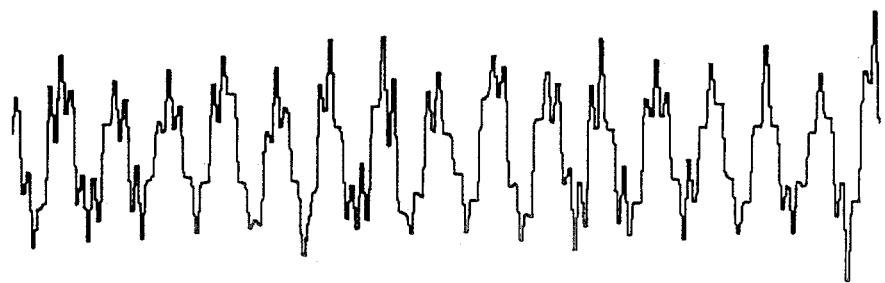
F I G. 13A
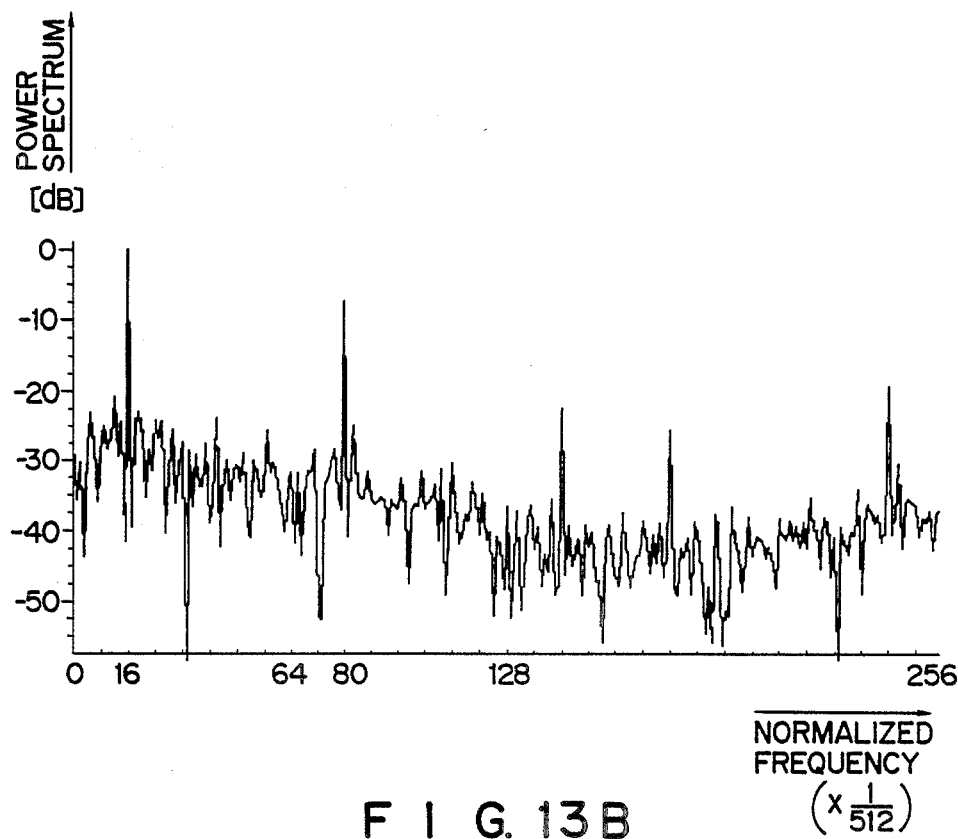
F I G. 13B

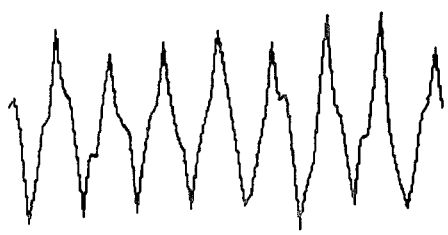
F I G. 14A
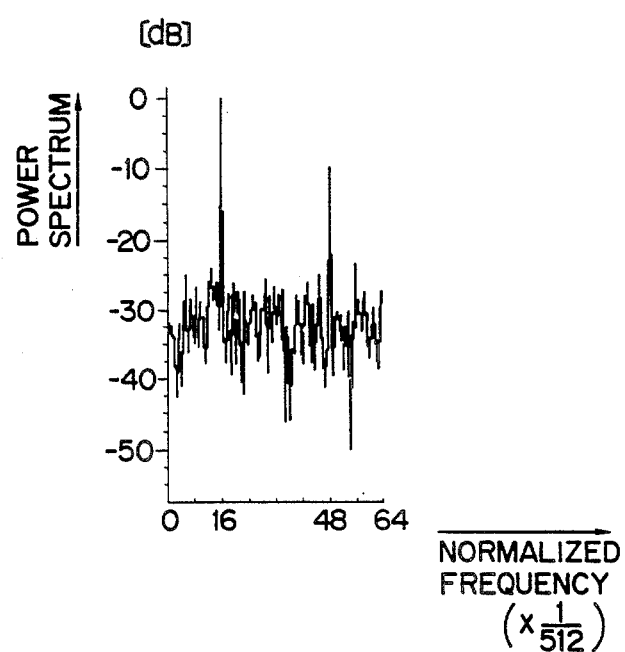
F I G. 14B

DIGITAL ANTI-ALIASING FILTER

BACKGROUND OF THE INVENTION

1. Field of the Invention

The present invention relates to an anti-aliasing filter.

2. Description of the Related Art

Generally, when an original signal having two line spectra f1 and f2 (f2>f1) and white noise is sampled at sampling frequency fs=2×fN, which is double Nyquist frequency fN (f1<fN<f2), folded noise (or aliasing noise) is generated at a position symmetrical with f2 about fN, i.e., fN−(f2−fN), and the level of white noise is increased. In this case, if the original signal is filtered through an ideal low-pass filter (LPF) having cutoff frequency fc=fN prior to sampling, components higher than fN are cut. Therefore, even if sampling is performed at fs, no folded noise is generated and the level of white noise is not increased. Such an LPF is called an anti-aliasing filter.

It is assumed that the signal is an image signal and that the magnification of the image is to be changed. In order to change the magnification, it is necessary to change the frequency the bandwidth of the output sampled signal. In this case, the sampling frequency must be changed because the Nyquist frequency is changed.

In general, it is difficult to arbitrarily change the cutoff frequency of an analog LPF. For this reason, the original signal may be temporarily converted into a digital signal so that an anti-aliasing filter can be realized by a linear digital LPF. Although a linear digital LPF can easily switch the cutoff frequency, its circuit size is increased if a high frequency signal such as a video signal is supplied to the LPF, and hence is not practical.

SUMMARY OF THE INVENTION

It is an object of the present invention to provide an anti-aliasing filter, in a system for sampling an original signal, which can reliably prevent mixing of folded noise even when a sampling frequency is changed because of changes in frequency bandwidth of the output sampled signal or the like.

An anti-aliasing filter according to the present invention is connected to a position in front of a circuit for sampling a signal using a sampling clock having a predetermined frequency, and comprises a non-linear digital filter for receiving digital data in synchronism with a clock pulse having a frequency not lower than the sampling clock, and for outputting Kth (a positive integer) data from the largest data of N input data in synchronism with the clock pulse. The digital filter includes a maximum filter for outputting a maximum value (K=1), a minimum filter for outputting a minimum value (K=N), a median filter for outputting a median value (K=N/2), and the like.

BRIEF DESCRIPTION OF THE DRAWINGS

FIG. 1 is a block diagram showing an overall system including an anti-aliasing filter according to a first embodiment of the present invention;

FIG. 2 is a block diagram of a maximum filter according to the first embodiment of the present invention;

FIGS. 3A to 14B are graphs showing simulation results of the operation of the present invention, in which FIGS. 3A and 3B show the waveform and power spectrum of an original signal, FIGS. 5A and 5B show the waveform and power spectrum of a signal obtained by filtering the original signal through the maximum filter, FIGS. 7A and 7B show the waveform and power spectrum of a signal obtained by filtering the original signal through a 5th order FIR type LPF, FIGS. 8A and 8B show a waveform and its power spectrum obtained by sampling the original signal filtered through the 5th order FIR type LPF, FIGS. 10A and 10B show a waveform and its power spectrum obtained by sampling the original signal filtered through the 11th order FIR type LPF, FIGS. 11A and 11B show the waveform and power spectrum of a signal obtained by filtering the original signal through a 21st order FIR type LPF, FIGS. 12A and 12B show a waveform and its power spectrum obtained by sampling the original signal filtered through the 21st FIR type LPF, FIGS. 13A and 13B show the waveform and power spectrum of a signal obtained by filtering the original signal through a median filter, and FIGS. 14A and 14B show the waveform and its power spectrum obtained by sampling the original signal filtered through the median filter.

DETAILED DESCRIPTION OF THE PREFERRED EMBODIMENT

Figure 4A:
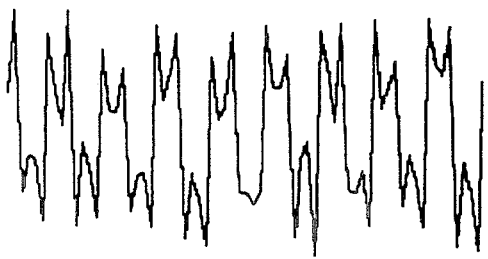
FIGS. 4A and 4B show a waveform and its power spectrum obtained by sampling the original signal.

FIG. 1 is a block diagram of an overall system including a first embodiment of the present invention.

Assume that an original signal is an analog signal. Input analog signal Ain is supplied to A/D converter 2 through analog LPF 1. LPF 1 uses frequency fa/2 as a cutoff frequency and limits a frequency band determined by filter characteristics. Frequency fa is the frequency of a clock pulse (or conversion clock pulse) of A/D converter 2.

An output from A/D converter 2 is supplied to sample circuit 4 through maximum filter 3. An output from sample circuit 4 is supplied to a circuit of the next stage as final sample output Dout.

Maximum filter 3 can arbitrarily set the number of sampling interval data (filter width). Maximum filter 3 is a nonlinear filter for outputting a maximum value of input data within a set filter width as a value representative of the width. A clock pulse of frequency fa is also supplied to maximum filter 3 so that input/output operation of data can be synchronized with the clock pulse. The filter width of maximum filter 3 is determined in accordance with fa/fb. Reference symbol fb denotes the frequency of a clock pulse (or sampling clock pulse) of sample circuit 4 and satisfies fa≧fb. FIG. 2 shows an example of maximum filter 3. In this case, a maximum value is detected by a tournament method.

In synchronism with clock pulse fa, an output from A/D converter 2 is sequentially supplied to series-connected eight latches 3a to 3h. The sampled data from the A/D converter 2 cascades through latches 3a to 3h, with latch 3a holding current data f(t) and 3h holding most previous data f(t−7). Outputs from paired latches 3a and 3b, 3c and 3d, 3e and 3b, and 3g and 3h are supplied to maximum detectors 3i, 3j, 3k, and 3l, each of which compares the two inputs and outputs the larger one. The maximum detectors all have the same arrangement. For example, maximum detector 3i comprises comparator 32 for comparing outputs from latches 3a and 3b; gate 34 on/off-controlled by an output from comparator 32, for selectively gating the output from latch 3a; gate 38 on/off-controlled by an output from comparator 32 through inverter 36, for selectively gating the output from latch 3b; and OR gate 40 for passing outputs from gates 34 and 38.

Similarly, outputs from paired maximum detectors 3i and 3j, and 3k and 3l are supplied to maximum detectors 3m and 3n. Outputs from maximum detectors 3m and 3n are also supplied to maximum detector 3o. With this operation, maximum detector 3o outputs a maximum value of the number sampling interval data included in the filter width.

FIG. 2 shows the case wherein the filter width is set to be 8. However, in order that the filter width be set to n(8>n), the data of latches 3(n+1) to 3h are cleared. For this purpose, a filter width setting signal W is supplied to the clear terminals of only the latches 3(n+1) to 3h.

According to such an arrangement, since maximum filter 3, which is a nonlinear filter, has functions of suppressing white noise and serves as an LPF, an anti-aliasing filter can be provided, which can prevent the mixing of folded noise during a sampling operation of sample circuit 4 by filtering an A/D-converted original signal with maximum filter 3 prior to sampling. In addition, changes in sampling frequency fb of sample circuit 4 can be properly compensated for by changing the filter width (preferably fa/fb) of maximum filter 3 by simply clearing the data of a certain number of latches. Therefore, the mixing of folded noise can be prevented at an arbitrary sampling frequency.

The effects of the maximum filter will be described with reference to the simulation waveforms.

FIGS. 3A and 3B respectively show the waveform and its power spectrum of an original analog signal. The power spectrum of the original analog signal includes line spectra f1 and f2, and white noise, which is substantially constant throughout the entire frequency range. The following signal is selected as original analog signal g(t):

$$g(t) = \cos 2'f1t + \cos 2'f2t + rnd(t) \quad (1)$$

where rnd(t) represents white noise and is a random number of −0.5 to +0.5, and f1=16/512, f2=80/512, fN=64/512, and fs=128/512. Frequency analysis was performed using a FFT circuit having a data number of 512 for the simulation. The frequency was normalized by a maximum frequency of the FFT. The sampling period (Ts=1/fs) was set as one sampling per 4 data.

Figure 4B:
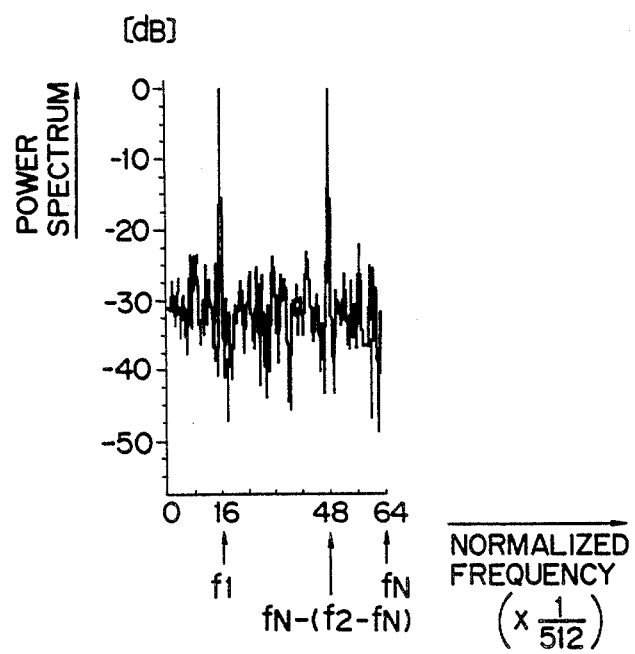

FIGS. 4A and 4B show a waveform and its power spectrum obtained by sampling original analog signal g(t at frequency fs. It is apparent from the power spectrum that folded noise is generated at a position symmetrical with f2 with respect to fN, i.e., fN−(f2−fN)(=48/512).

In contrast to this, FIGS. 5A and 5B show a waveform and its power spectrum obtained by filtering the original analog signal g(t) with the maximum filter, respectively.

As the maximum filter, a filter having the following characteristics is used:

$$f(t) = \{\text{maximum value of } f(t-no) \text{ to } f(t+no)\} \quad (2)$$

where the filter width is 2no+1=5, f(t−no) to f(t+no) are input signals, and f(t) is an output signal.

Line spectrum f2 is reduced to a level lower than the original signal by about 17 dB. In addition, line spectrum components other than line spectra f1 and f2 are mixed. The white noise is decreased to frequencies lower than frequency fN. Thus, it is understood that the maximum filter exhibits the characteristics of an LPF having frequency fN as a cutoff frequency.

Figure 6A:
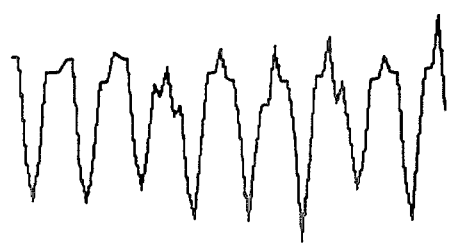
FIGS. 6A and 6B show a waveform and its power spectrum obtained by sampling the original signal filtered through the maximum filter.
Figure 6B:
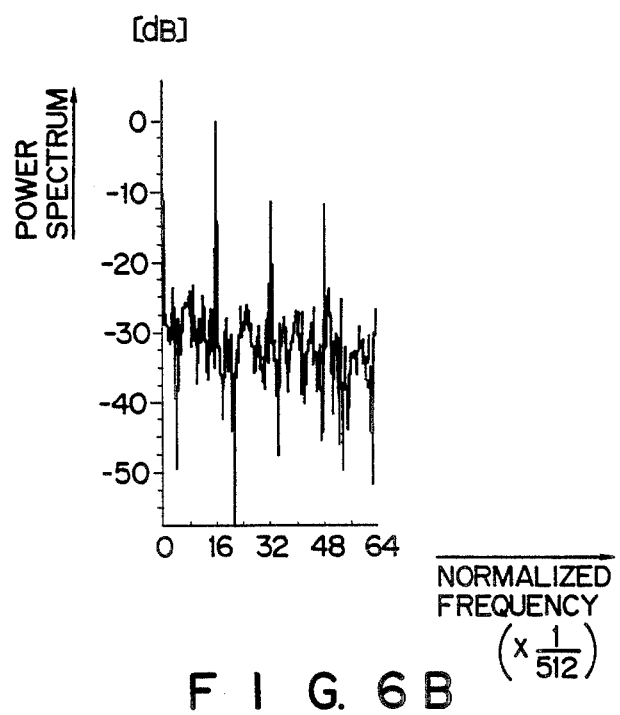

FIGS. 6A and 6B respectively show a waveform and its power spectrum obtained by sampling the signal in FIG. 5A at frequency fs. In this case, line spectra of folded noise are generated at fN−(f2−fN)(=48/512) and at a frequency of 32/512. However, they are lower than line spectrum f1 by 12 dB.

For the purpose of comparison, simulation was performed using Finite Impulse Response (FIR) type linear digital LPFs (filter widths (=orders) were 5, 11, and 21) in place of the maximum filter. A FIR type LPF has the following characteristics:

$$f(t) = \sum_{k=-no}^{no} h(k)f(t-k) \quad (3)$$

where $$h(k) = \frac{1}{A} \cdot \frac{\sin(k/Ts)}{(k/Ts)}, A = \sum_{k=-no}^{no} h(k),$$

and the filter width is 2no+1. The filter width, because it is close to the sampling period (=4), is set to be 5.

FIGS. 7A and 7B respectively show a waveform and its power spectrum obtained by filtering original signal g(t) through a 5th order FIR type LPF. In this case, cutoff frequency fc=fN, and line spectrum f2 is lower than line spectrum f1 by 7.5 dB.

FIGS. 8A and 8B show a waveform and its power spectrum obtained by sampling the signal in FIG. 7A at fs.

Figure 9A:
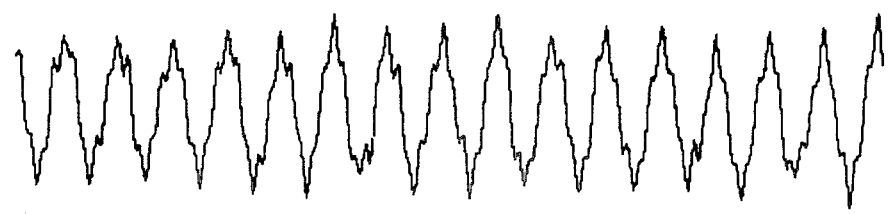
FIGS. 9A and 9B show the waveform and power spectrum of a signal obtained by filtering the original signal through an 11th order FIR type LPF.
Figure 9B:
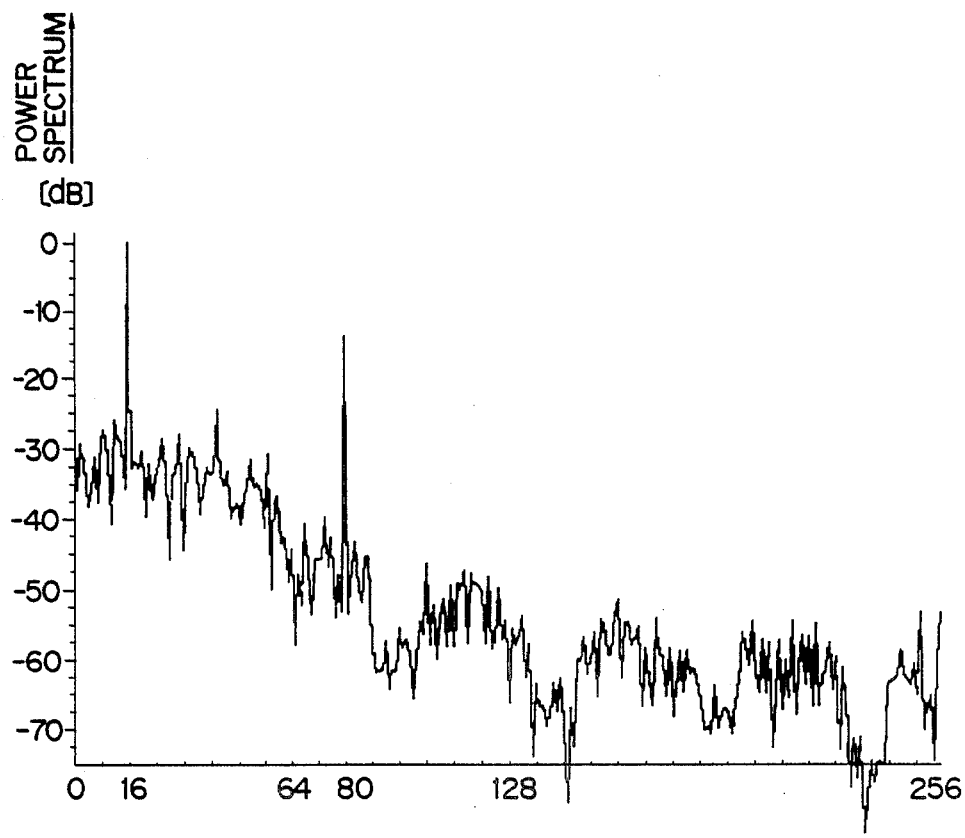

FIGS. 9A and 9B show a waveform and its power spectrum obtained by filtering original signal g(t) through an 11th order FIR type LPF.

FIGS. 10A and 10b show a waveform and its power spectrum obtained by sampling the signal in FIG. 9A at fs.

FIGS. 11A and 11B show a waveform and its power spectrum obtained by filtering original signal g(t) through a 21st order FIR type LPF.

FIGS. 12A and 12B show a waveform and its power spectrum obtained by sampling the signal in FIG. 11A at fs.

It was discovered from this simulation result that the maximum filter has an anti-aliasing effect (LPF effect) which is equivalent or superior to that of the FIR type LPF having the same filter width. In order to obtain a perfect anti-aliasing effect using an FIR type filter, a higher order (filter width) is required. The maximum filter can remove a spike noise from a signal without destroying the edge of the signal. If an FIR type LPF having a filter width which is equivalent to the sampling width is used, folded noise is generated. In other words, the maximum filter has the anti-aliasing effect and has the effect equivalent to that of an FIR type LPF having the same order. The circuit arrangement of the maximum filter is simpler than that of the FIR type LPF.

The present invention is not limited to the maximum filter. The same effect as described above can be obtained by using other nonlinear digital filters. For example, a minimum or median filter may be used.

FIGS. 13A and 13B respectively show a waveform obtained and its power spectrum by filtering the original signal through the median filter. A filter having the f(t)={median value of f(t−no) to f(f+no)}    (4)

where the filter width is 2no +1=5.

FIGS. 14A and 14B show a waveform and its power spectrum obtained by sampling the signal in FIG. 13A at fs.

In FIG. 13A, even when utilizing the median filter, the frequency component of white noise is reduced to a level lower than that of fN, and hence the LPF effect can be recognized. Line spectrum f2 is reduced to a level lower than line spectrum f1 by 7 dB. It can be seen from FIGS. 14A and 14B that the line spectrum of folded noise at fN−(f2−fN) is reduced to a level lower than line spectrum f1 by about 10 dB. In addition, the maximum filter does not generate folded noise at frequencies near 32/512. Accordingly, extra harmonic components are not generated when the median filter is used. In this manner, the median filter has characteristics superior to those of the maximum filter. The nonlinear digital filter is not limited to the case wherein it is constituted by discrete elements, and it may be realized by a CPU using software.

Figure 15:
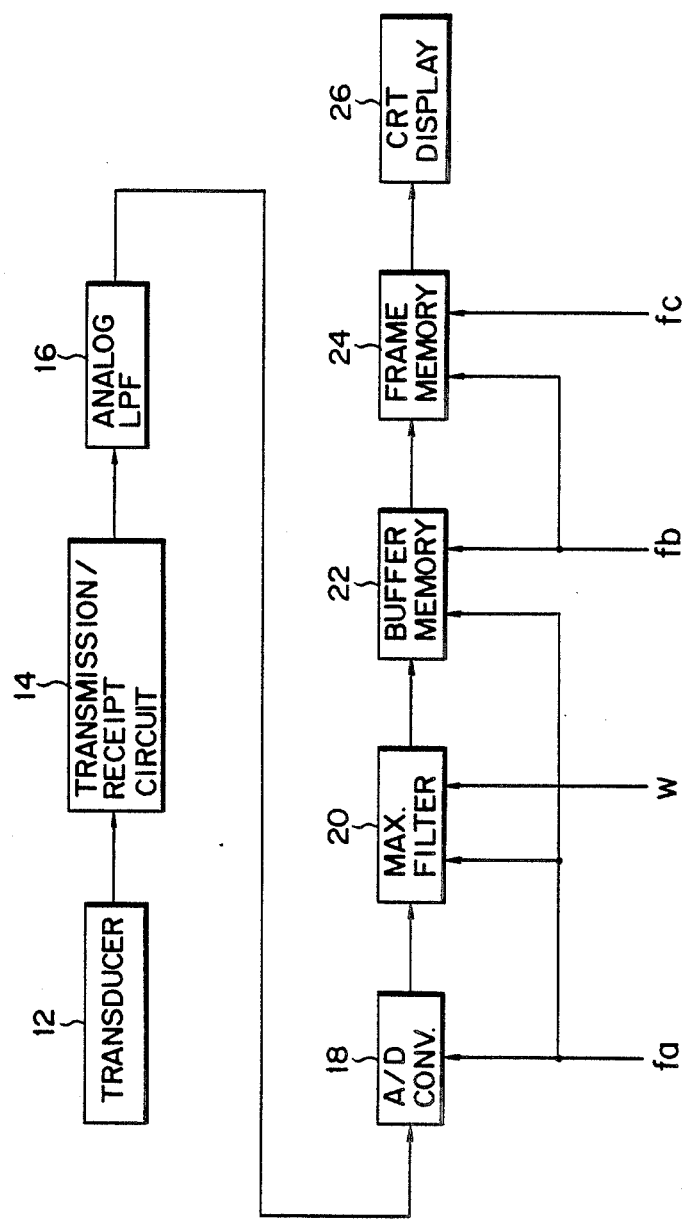
FIG. 15 is a block diagram showing an ultrasonic diagnosing apparatus to which the anti-aliasing filter of the present invention is applied.

FIG. 15 is a block diagram showing an ultrasonic diagnosing apparatus to which the anti-aliasing filter of the present invention is applied. Transmission/receipt circuit 14 is connected to transducer 12. A reception signal output from transmission/receipt circuit 14 is supplied to buffer memory 22 via analog LPF 16, A/D converter 18, and maximum filter 20. Clock pulse fa is supplied to A/D converter 18, maximum filter 20, and buffer memory 22. Clock pulse fa becomes a write clock of buffer memory 22 and is a constant value. Maximum filter 20 also receives filter width setting signal W.

Data is read out from buffer memory 22 and is written in frame memory 24 in synchronism with clock pulse fb(fa≧fb). Clock pulse fb is a variable pulse.

The data is read out from frame memory 24 in synchronism with clock pulse fc (constant), and is displayed on CRT display section 26. Clock pulse fb is changed in accordance with the display magnification of the data.

This apparatus displays tomographic image data obtained by utilizing the reflection of ultrasonic echoes at an arbitrary magnification. Components of a signal in a band higher than fa/2 are cut by analog LPF 16, and the signal is A/D-converted in synchronism with clock pulse fa. The frequency of a write clock sent to frame memor 24 associated with the display magnification is set to be fb. Then, the obtained digital signal is filtered through maximum filter 20 having filter width fa/fb. This maximum filter serves as an LPF (anti-aliasing filter) having a cutoff frequency of fb/2.

This output signal is temporarily written in buffer memory 22. Since the signal is read out from buffer memory 22 using clock fb which is different from fa, sampling is performed. However, since the folded noise has been removed from the signal stored in the write operation in buffer memory 22, folded noise is not generated in the signal upon sampling.

The signal read out from buffer memory 22 is coordinate-converted, written in frame memory 24, and is then read out in a format of display section 26.

In the ultrasonic diagnosing apparatus, low-level spike noise is sometimes generated in an input signal due to phase interference. For this reason, low-level spike noise can be effectively removed by the maximum filter since it does not destroy the edge of the signal.

As has been described above, according to the present invention, low-frequency components can be cut off from reaching a signal prior to sampling by using a nonlinear digital filter, which generally has a simpler arrangement than that of a linear digital filter, thereby providing an anti-aliasing filter having a simple arrangement. This anti-aliasing filter can easily respond to changes in sampling frequency by changing its filter width and can effectively remove a spike noise from a signal without destroying the edge of the signal.

What is claimed is:

1. A sampling circuit comprising:
   a nonlinear digital filter means for receiving digital data, for storing a number W of past values of the received digital data, and for outputting the largest value of said W stored past values of said digital data, the storing and outputting occurring synchronously with a first clock signal having a first frequency; and
   a sampling means for sampling the outputted largest values from said nonlinear digital filter synchronously with a second clock signal having a second frequency, said first frequency being at least as high as said second frequency.

2. The sampling circuit according to claim 1, further comprising:
   an A/D converter means for converting an input analog signal into digital data and for outputting said digital data to said nonlinear digital filter means, the converting and the outputting occurring synchronously with said first clock signal.

3. The sampling circuit according to claim 1 wherein said nonlinear digital filter has a cutoff frequency and wherein said number W can be changed to change said cutoff frequency.

4. A sampling circuit comprising:
   a nonlinear digital filter means for receiving digital data, for storing a number W of past values of the received digital data, and for outputting the smallest value of said W stored past values of said digital data, the storing and outputting occurring synchronously with a first clock signal having a first frequency; and
   a sampling means for sampling the outputted smallest values from said nonlinear digital filter synchronously with a second clock signal having a second frequency, said first frequency being at least as high as said second frequency.

5. The sampling circuit according to claim 4, further comprising:
   an A/D converter means for converting an input analog signal into digital data and for outputting said digital data to said nonlinear digital filter means, the converting and the outputting occurring synchronously with said first clock signal.

6. The sampling circuit according to claim 4 wherein said nonlinear digital filter has a cutoff frequency and wherein said number W can be changed to change said cutoff frequency.

7. A sampling circuit comprising:
a nonlinear digital filter means for receiving digital data, for storing a number W of past values of the received digital data, and for outputting the average value of said W stored past values of said digital data, the storing and outputting occurring synchronously with a first clock signal having a first frequency; and
a sampling means for sampling the outputted average values from said nonlinear digital filter synchronously with a second clock signal having a second frequency, said first frequency being at least as high as said second frequency.

8. The sampling circuit according to claim 7, further comprising:
an A/D converter means for converting an input analog signal into digital data and for outputting said digital data to said nonlinear digital filter means, the converting and the outputting occurring synchronously with said first clock signal.

9. The sampling circuit according to claim 7 in wherein said nonlinear digital filter has a cutoff frequency and wherein said number W can be changed to change said cutoff frequency.

10. An ultrasonic tomographic imaging apparatus for displaying tomographic image data on a CRT display, comprising:
an A/D converter means for converting a reflected ultrasonic echo signal representing a tomographic image into digital data and for outputting said digital data, the converting and outputting occurring synchronously with a first clock signal having a first frequency;
a nonlinear low pass digital filter means for receiving said digital data from said A/D converter means, for storing a number W of past values of the received digital data, and for outputting low pass filtered digital data based on a manipulation of said W past values, the storing and outputting occurring synchronously with a first clock signal having a first frequency;
a buffer memory means for receiving, storing, and outputting the output data from said nonlinear low pass digital filter means, the receiving occurring synchronously with said first clock signal having said first frequency, the outputting occurring synchronously with the a second clock signal having a second frequency, said first frequency being at least as high as said second frequency; and
a frame memory means for receiving the output data from said buffer memory means synchronously with said second clock signal, and for outputting said output data synchronously with a third clock signal having a third frequency corresponding to the display speed of the CRT display.

11. The tomographic imaging apparatus of claim 10 wherein said manipulation of said W past values constitutes a maximum filter in which said outputted low pass filtered data is the largest value of said W past values.

12. The tomographic imaging apparatus of claim 10 wherein said manipulation of said W past values constitutes a minimum filter in which said outputted low pass filtered data is the smallest value of said W past values.

13. The tomographic imaging apparatus of claim 10 wherein said manipulation of said W past values constitutes a median filter in which said outputted low pass filtered data is the average value of said W past values.

14. The tomographic imaging apparatus of any one of claims 11 through 13 wherein said nonlinear low pass digital filter means has a cutoff frequency which decreases when the number W is increased for a constant frequency of said first clock signal, said cutoff frequency being controlled by changing said number W so that said cutoff frequency remains approximately equal to half the frequency of said second clock signal.

15. The tomographic imaging apparatus of claim 14 wherein the tomographic image data is displayed on said CRT at a variable magnification and wherein said frequency of said second clock signal is changed due to a change in displayed magnification of the tomographic image.

* * * * *